United States Patent
Chan et al.

(10) Patent No.: US 7,478,297 B2
(45) Date of Patent: *Jan. 13, 2009

(54) MERGED MISR AND OUTPUT REGISTER WITHOUT PERFORMANCE IMPACT FOR CIRCUITS UNDER TEST

(75) Inventors: Yuen H. Chan, Poughkeepsie, NY (US);
William V. Huott, Holmes, NY (US);
Pradip Patel, Poughkeepsie, NY (US);
Daniel Rodko, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/876,036

(22) Filed: Oct. 22, 2007

(65) Prior Publication Data

US 2008/0059854 A1    Mar. 6, 2008

Related U.S. Application Data

(63) Continuation of application No. 11/056,575, filed on Feb. 11, 2005, now Pat. No. 7,305,602.

(51) Int. Cl.
*G01R 31/28* (2006.01)
(52) U.S. Cl. ..................................................... 714/726
(58) Field of Classification Search ................... 714/726
See application file for complete search history.

(56) References Cited

U.S. PATENT DOCUMENTS

| 5,553,082 A | 9/1996 | Connor et al. |
| 6,421,794 B1 | 7/2002 | Chen et al. |
| 2005/0222816 A1* | 10/2005 | Cheng et al. ................ 702/185 |
| 2006/0101316 A1 | 5/2006 | Wang et al. |

* cited by examiner

*Primary Examiner*—James C Kerveros
(74) *Attorney, Agent, or Firm*—Lynn L. Augspurger; L. J. Marhoefer

(57) ABSTRACT

The output register of an array and the Multiple Input Signature Register (MISR) logic is implemented with one set of L1/L2 master/slave latches and single additional slave latch. This new combined logic uses less critical area on a chip without a performance impact on the array access time or circuit testing.

4 Claims, 4 Drawing Sheets

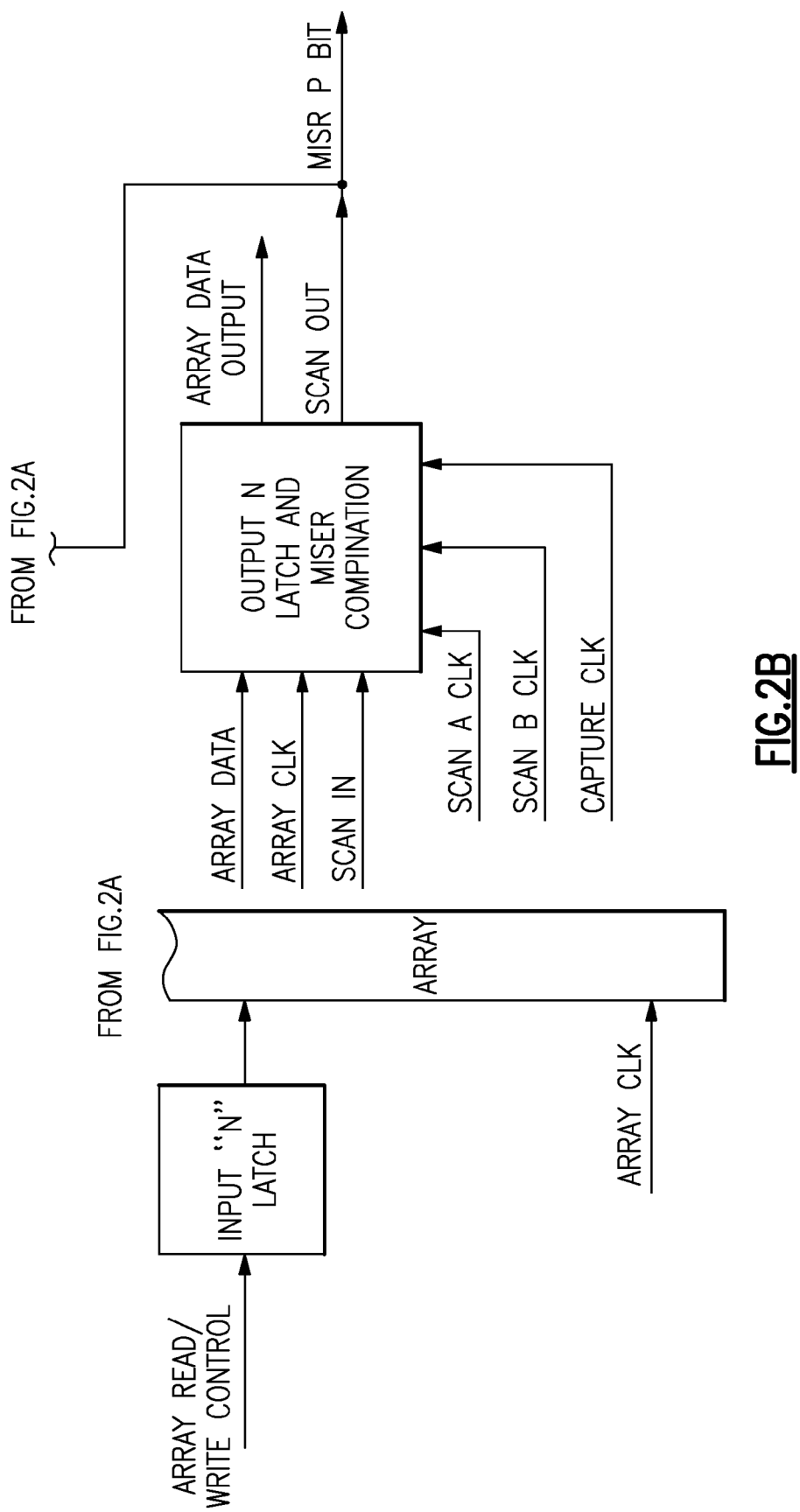

MERGED MISR AND OUTPUT REGISTER WITHOUT PERFORMANCE IMPACT FOR CIRCUITS UNDER TEST

CROSS REFERENCE TO RELATED APPLICATIONS

This application is a continuation of Ser. No. 11/056,575 filed on Feb. 11, 2005, now U.S. Pat. No. 7,305,602. Applicant claims the priority of the parent application and incorporates it by reference. This application contains subject matter that is related to the subject matter of the following applications, each of which is assigned to the same assignee as this application, International Business Machines Corporation of Anmonk, New York, and is filed concurrently herewith. Each of the below listed applications is hereby incorporated herein by reference. Circuit for Interfacing Local Bitlines With Global Bitline, U.S. patent application Ser. No. 11/054,296, filed Feb. 9, 2005, now ; Global Bit Select Circuit With Dual Read and Write Bit Line Pairs, U.S. patent application Ser. No. 11/054,309, filed Feb. 9, 2005; Local Bit Select Circuit With Slow Read Recovery Scheme, U.S. patent application Ser. No. 11/054,148 filed Feb. 9, 2005 now U.S. Pat. No. 7,102,946, issued Sep. 5, 2006; Global Bit Line Restore Timing Scheme and Circuit, U.S. patent application Ser. No. 11/054,072 filed Oct. 30, 2006, now U.S. Pat. No. 7,272,030, issued Sep. 18, 2007; Local Bit Select With Suppression, U.S. patent application Ser. No. 11/054,402, now U.S. Pat. No. 7,113,433, issued Sep. 26, 2006.

BACKGROUND OF THE INVENTION

1. Field of the Invention

This invention relates to an improved implementation of a Multiple Input Signature Register (MISR) for arrays employing a test scan output data register, and more particularly a combination of array output data register and MISR that reduces the number of wiring channels and overall use of critical chip area without impacting array performance.

2. Description of the Background

As will be appreciated by those skilled in the art, as the design of electronic integrated circuit chips has progressed, more and more circuitry is being disposed in increasingly dense patterns and it is becoming correspondingly more difficult to test such circuits. One methodology for performing chip test is described in U.S. Pat. No. 4,071,902, assigned to the assignee of this application and incorporated herein by reference. This patent describes the basic features of level sensitive scan design (LSSD) systems for circuit test. A further aid to device and system testing is the method called self-test. A methodology for self-test in and LSSD environment is described in U.S. Pat. No. 4,503,537 assigned to the assigned to the assignee of this application and incorporated herein by reference. Here, during test, the test scan outputs of shift register strings are fed to a so-called Multiple Input Signature Register (MISR). The signals fed to the MISR are compressed within the MISR to form a resultant or signature at the end of the test that can be compared with the expected or good signature for a pass/fail decision.

FIGS. 1A and 1B show a traditional combination of an array output register and an MISR. An array 12 has a plurality of inputs held in a series of L1/L2 input latches 14 and 16, only two of which are shown L10/L20 and L1N/L2N and a corresponding series of L1/L2 output latches 18 and 20 respectively, only two of which are shown, L10/L20 and L1N/L2N. The array 12 is, a Static Random Access Memory (SRAM), but it will be appreciated that the principles of the invention are applicable generally to digital circuit arrays. The output of the array (ARRAY DATA) is one input to the master L1 latch 18. The other inputs to latch 18 arc an array clock signal (ARRAY CLOCK), a scan in signal SCAN IN, and a scan in A clock SCAN A CLK. The output of latch 18 is fed to a listening MSIR register comprised of master (L1) latch 22 and slave (L2) latch 24 via an XOR gate 26, whose other input is an MISR P bit indicating the binary state of different combination of master slave output register latch and a MISR for signature capture in the MISR. The master/slave registers 22 and 24 can be scan initialized with the SCAN A clock and SCAN B clock respectively. The scan output of the master slave latch 18/20 is fed to the scan in of the master/slave latch 22/24. This implementation needs two sets of master/slave latches, the output L1/L2 latch 18/20 and the MISR L1/L2 latch 22/24, and the XOR gate 26. This logic at the output of the array requires a number of wiring channels requires the use of critical area on the chip.

BRIEF DESCRIPTION OF THE INVENTION

An object of this invention is the provision of an improved combination of array output data register and MISR that requires fewer wiring channels and less chip area than that of the prior art.

Another object of the invention is the provision of an improved combination of array output data register and MISR without impact on the array or circuit under test.

Briefly, this invention contemplates a combination in which the output register of an array and the Multiple Input Signature Register (MISR) logic is implemented with one set of L1/L2 master/slave latches and single additional slave latch. This new combined logic uses less critical area on a chip without a performance impact on the array access time or circuit testing.

BRIEF DESCRIPTION OF THE DRAWINGS

The subject matter that is regarded as the invention is particularly pointed out and distinctly claimed in the claims at the conclusion of the specification. The forgoing and other objects, features, and advantages of the invention are apparent from the following detailed description taken in conjunction with the accompanying drawings in which:

FIGS. 2A and 2B comprise two parts of single partial block diagram and partial schematic diagram of an array output latch register and an MISR combination in accordance with the teachings of this invention.

DETAILED DESCRIPTION OF THE INVENTION

Figure 1A:
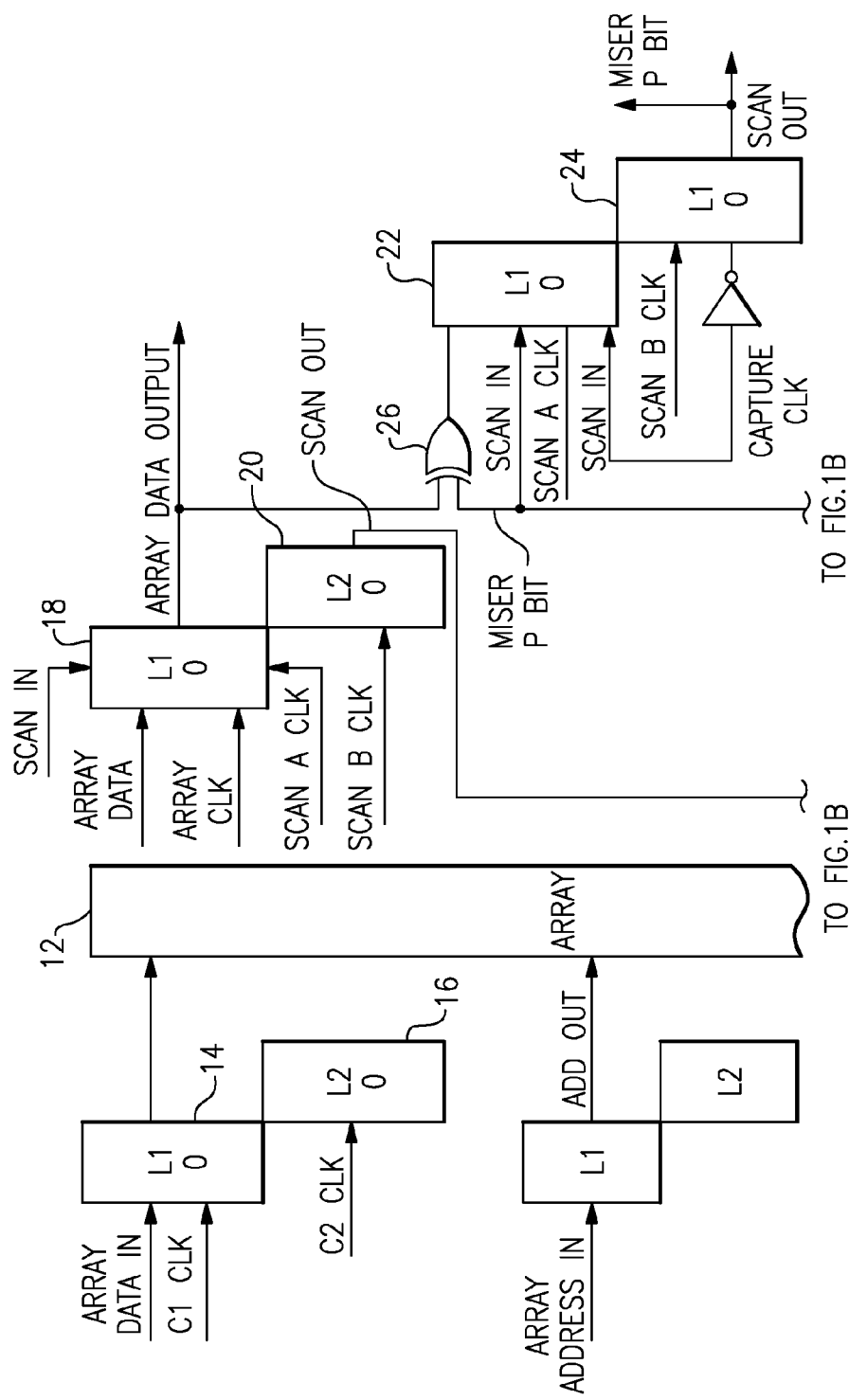
FIGS. 1A and 1B comprise two parts of a single partial block diagram and partial schematic diagram of a prior art implementation of array output latch register and an MISR.
Figure 1B:
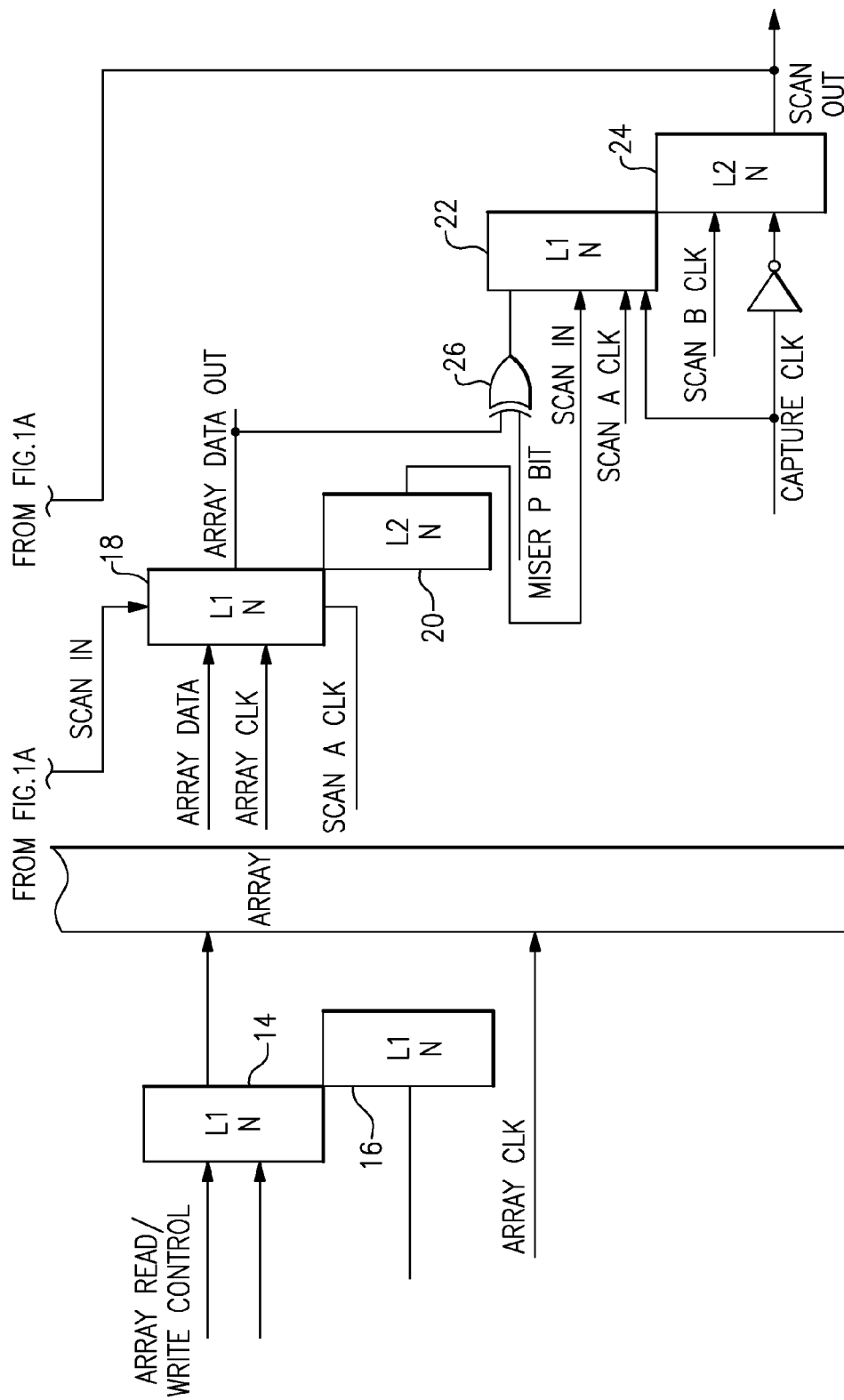
Figure 2A:
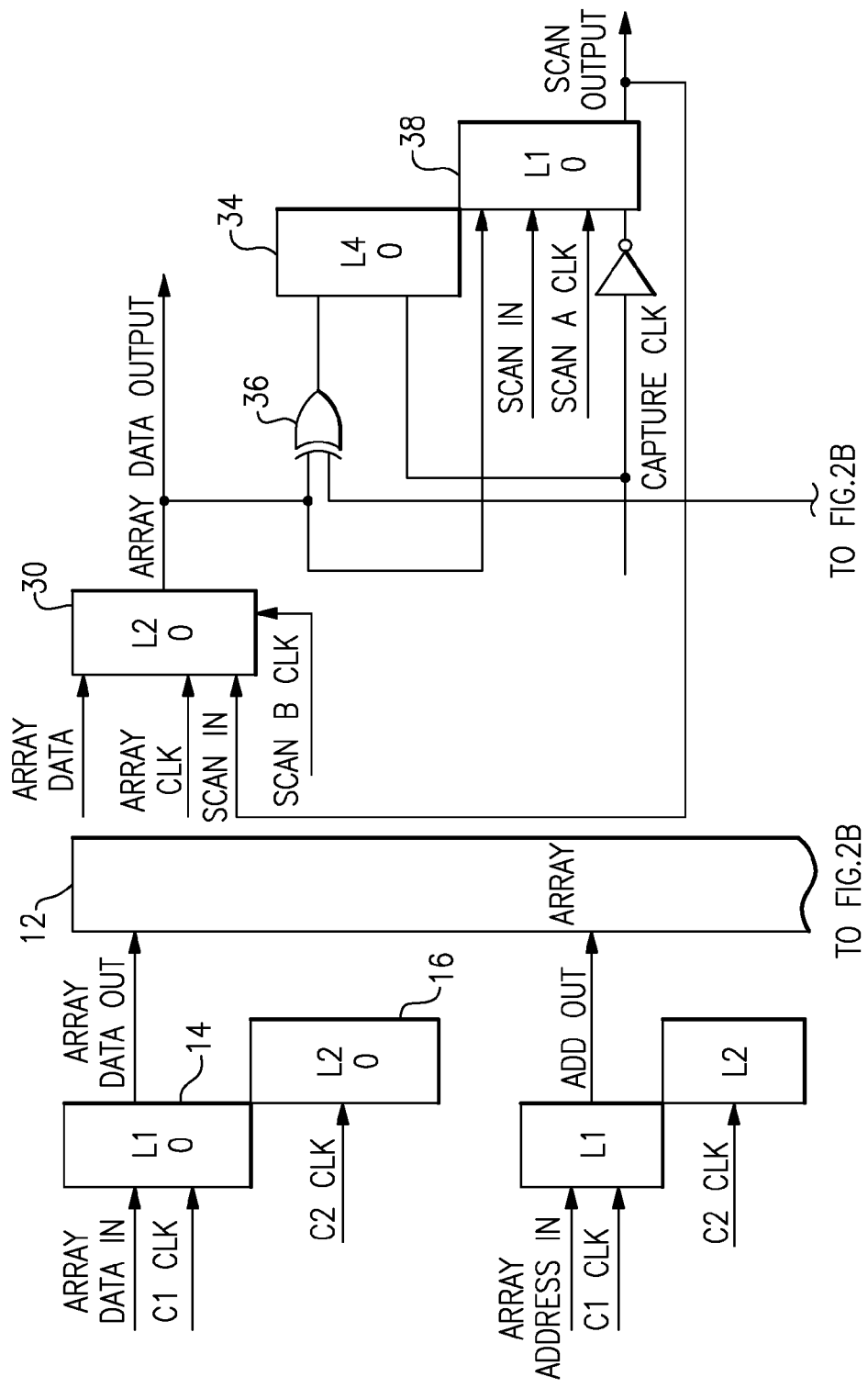

Referring now to FIGS. 2A and 2B, it will be appreciated that inputs to the array 12 are the same as in FIG. 1 and that only the one "0" input is shown in detail, although each input "0" through "N" is the same. Similarly, each output combination of output latch register latch and MISR is the same for all outputs "0" through "N", only the "0" output is shown in detail. In the specific embodiment of the invention shown in FIGS. 2A and 2B, the raw output of the array 12 is fed to a slave output L2 output register latch 30. In system operation this L2 output register latch 30 is clocked by the array 12 clock (ARRAY CLK) and the array data output (ARRAY DATA OUTPUT) is available at the output of register latch 30.

The array data output of the L2 slave register latch 30 is also fed to a non-scan (L4) slave register latch 32 through a XOR 34 gate in order to implement the MISR logic function. The output of the slave register latch 32 is coupled to the input of a master L1 register latch 38. When the MISR logic is ON, the combination of L4 register latch 34 and the master (L1) register latch 38 will capture the pass/fail signature for the MISR test. The L2 register latch 30 always contains the array output data. During MISR testing, the array data output is latched into the L4/L1 register latches 34 and 38 respectively by the capture clock (CAPTUE CLK) which is in phase with array clock. It will be appreciated that to scan initialize the output registers, there is only one master (L1)/slave (L2) register latch pair 38/30 in the scan patch.

While the preferred embodiment of the invention has been described, it will be understood that those skilled in the art, both now and in the future, may make various improvements and enhancements which fall within the scope of the claims which follow. These claims should be construed to maintain the proper protection for the invention first described.

The invention claimed is:

1. In a data processing system, a master-slave register pair for processing built-in self-test scan data in addition to process data, comprising in combination;

a slave register having a process data input, a process data clock input, a slave clock input, a scan data input, and a slave register output;

a master register having a scan data input, a master clock input, an input coupled to said slave register output, and a master register output; and said master register output connected to said slave register scan data input.

2. In a data processing system as in claim 1, wherein said master register includes a capture clock input in phase with said process data clock input.

3. A method for processing array data and built-in self-test scan data including the steps of:

processing array data in a slave register having an array data input and an array data output whose timing is controlled by an array clock in processing array data and a scan data input controlled by slave clock in processing scan data;

storing scan data in a master register having an input coupled to said array data output, a scan data input, a master clock input, and a scan data output; and coupling said scan data output to said scan data input in processing scan data.

4. A method for processing array data and built-in self-test scan data as in claim 3 including the step of clocking the master register with a capture clock in phase with said array clock.

* * * * *